(12) United States Patent
Masuda

(10) Patent No.: US 10,930,492 B2
(45) Date of Patent: Feb. 23, 2021

(54) METHOD FOR PRODUCING SIC EPITAXIAL WAFER AND APPARATUS FOR PRODUCING SIC EPITAXIAL WAFER

(71) Applicant: SHOWA DENKO K.K., Tokyo (JP)

(72) Inventor: Tatsuya Masuda, Chichibu (JP)

(73) Assignee: SHOWA DENKO K.K., Tokyo (JP)

( * ) Notice: Subject to any disclaimer, the term of this patent is extended or adjusted under 35 U.S.C. 154(b) by 236 days.

(21) Appl. No.: 15/751,185

(22) PCT Filed: Aug. 18, 2016

(86) PCT No.: PCT/JP2016/074103
§ 371 (c)(1),
(2) Date: Feb. 8, 2018

(87) PCT Pub. No.: WO2017/043282
PCT Pub. Date: Mar. 16, 2017

(65) Prior Publication Data
US 2018/0233354 A1    Aug. 16, 2018

(30) Foreign Application Priority Data
Sep. 11, 2015   (JP) .............................. JP2015-180099

(51) Int. Cl.
*H01L 21/205*   (2006.01)
*H01L 21/67*   (2006.01)
(Continued)

(52) U.S. Cl.
CPC ...... *H01L 21/02167* (2013.01); *C23C 16/325* (2013.01); *C23C 16/455* (2013.01);
(Continued)

(58) Field of Classification Search
CPC ......... H01L 21/02167; H01L 21/02378; H01L 21/02293; H01L 21/0262; H01L 21/67103;
(Continued)

(56) References Cited

U.S. PATENT DOCUMENTS 4,860,687 A * 8/1989 Frijlink ............... C23C 16/4584
118/500
5,463,978 A * 11/1995 Larkin ................... C30B 25/02
117/89
(Continued)

FOREIGN PATENT DOCUMENTS

FR        2596070      *  9/1987 ......... C23C 16/4584
JP       2771585 B2      7/1998
(Continued)

OTHER PUBLICATIONS

International Search Report for PCT/JP2016/074103 dated Nov. 15, 2016 [PCT/ISA/210].
(Continued)

*Primary Examiner* — Mary A Wilczewski
(74) *Attorney, Agent, or Firm* — Sughrue Mion, PLLC

(57) ABSTRACT

A method for producing a SiC epitaxial wafer using an apparatus including a mounting plate having a recessed accommodation portion and a satellite disposed in the recessed accommodation portion, and configured so that a SiC substrate is placed on an upper surface thereof. The method includes supplying a dopant carrier gas to an outer circumference of the SiC epitaxial wafer from between the recessed accommodation portion and the satellite.

18 Claims, 5 Drawing Sheets

(51) Int. Cl.
*H01L 21/673* (2006.01)
*C23C 16/32* (2006.01)
*C23C 16/455* (2006.01)
*C30B 25/14* (2006.01)
*C30B 29/36* (2006.01)
*C23C 16/458* (2006.01)
*H01L 21/02* (2006.01)
*C30B 25/12* (2006.01)
*H01L 21/687* (2006.01)

(52) U.S. Cl.
CPC .......... *C23C 16/4584* (2013.01); *C30B 25/12* (2013.01); *C30B 25/14* (2013.01); *C30B 29/36* (2013.01); *H01L 21/0262* (2013.01); *H01L 21/02293* (2013.01); *H01L 21/02378* (2013.01); *H01L 21/02529* (2013.01); *H01L 21/673* (2013.01); *H01L 21/67017* (2013.01); *H01L 21/67103* (2013.01); *H01L 21/68764* (2013.01); *H01L 21/68771* (2013.01)

(58) Field of Classification Search
CPC ............. H01L 21/67017; H01L 21/673; H01L 21/68764; H01L 21/68771; H01L 21/02529; C30B 29/36; C30B 25/02; C30B 25/12; C30B 25/14; C30B 25/20; C23C 16/325; C23C 16/4584; C23C 16/455
See application file for complete search history.

(56) References Cited

U.S. PATENT DOCUMENTS

| | | | | |
|---|---|---|---|---|
| 5,709,745 A * | 1/1998 | Larkin | .................... | C30B 25/02 117/96 |
| 5,788,777 A * | 8/1998 | Burk, Jr. | ............. | C23C 16/4584 118/730 |
| 6,569,250 B2 * | 5/2003 | Paisley | ................. | C23C 16/325 118/730 |
| 6,811,614 B2 * | 11/2004 | Kappeler | ............ | C23C 16/4584 117/901 |
| 10,121,865 B2 * | 11/2018 | Hori | .................. | H01L 21/02433 |
| 2002/0090454 A1 * | 7/2002 | Paisley | ............. | C23C 16/45519 427/248.1 |
| 2003/0036471 A1 * | 2/2003 | Goela | ..................... | C23C 16/01 501/88 |
| 2003/0079689 A1 * | 5/2003 | Sumakeris | .......... | C23C 16/4581 118/725 |
| 2003/0188687 A1 * | 10/2003 | Paisley | ............... | C23C 16/4584 118/730 |
| 2006/0252243 A1 * | 11/2006 | Kishimoto | .............. | C30B 25/12 438/607 |
| 2007/0062455 A1 * | 3/2007 | Saxler | ................... | C23C 14/505 118/730 |
| 2007/0065577 A1 | 3/2007 | Sumakeris et al. | | |
| 2007/0108450 A1 * | 5/2007 | O'Loughlin | ............ | C30B 25/02 257/77 |
| 2009/0085044 A1 * | 4/2009 | Ohno | ................ | H01L 21/02378 257/77 |
| 2014/0145214 A1 * | 5/2014 | Kageshima | ............. | C30B 29/36 257/77 |
| 2014/0264384 A1 * | 9/2014 | Loboda | ............. | H01L 21/02529 257/77 |
| 2015/0079764 A1 | 3/2015 | Nishitani | | |
| 2015/0267320 A1 * | 9/2015 | Ohno | .................... | C30B 25/186 117/97 |

FOREIGN PATENT DOCUMENTS

| | | |
|---|---|---|
| JP | 2835338 B2 | 12/1998 |
| JP | 2002-057109 A | 2/2002 |
| JP | 2005-537678 A | 12/2005 |
| JP | 2014-216605 A | 11/2014 |
| JP | 2015-32630 A | 2/2015 |
| JP | 2015-056635 A | 3/2015 |
| WO | 2015/098283 A1 | 7/2015 |

OTHER PUBLICATIONS

Notice of Allowance dated Jun. 2, 2020, from the Japanese Patent Office in counterpart Application No. 2019-121537.

* cited by examiner

METHOD FOR PRODUCING SIC EPITAXIAL WAFER AND APPARATUS FOR PRODUCING SIC EPITAXIAL WAFER

CROSS REFERENCE TO RELATED APPLICATIONS

This application is a National Stage of International Application No. PCT/JP2016/074103 filed Aug. 18, 2016, claiming priority based on Japanese Patent Application No. 2015-180099 filed Sep. 11, 2015, the contents of all of which are incorporated herein by reference in their entirety.

TECHNICAL FIELD

The present invention relates to a method for producing a SiC epitaxial wafer and an apparatus for producing a SiC epitaxial wafer.

BACKGROUND ART

Silicon carbide (SiC) has characteristics such that the dielectric breakdown field is larger by one order of magnitude, the band gap is three times larger, and the thermal conductivity is approximately three times higher than those of silicon (Si). Since silicon carbide has such characteristics, application thereof to power devices, high-frequency devices, high-temperature operation devices, and the like is expected. Therefore, in recent years, SiC epitaxial wafers have been used in semiconductor devices as described above.

A SiC epitaxial wafer is produced by growing a SiC epitaxial film, which is an active region of a SiC semiconductor device, on a SiC substrate. The SiC substrate is obtained by processing a bulk single crystal of SiC fabricated by a sublimation method or the like, and the SiC epitaxial film is formed by a chemical vapor deposition method (CVD).

As an apparatus for producing a SiC epitaxial wafer, a horizontal rotation and revolution type epitaxial growth apparatus is known (for example, Patent Documents 1 and 2). In the horizontal rotation and revolution type epitaxial growth apparatus, a plurality of wafers are horizontally arranged, and while each of the wafers is revolved, the wafer itself is caused to rotate about the center of the wafer as the axis.

The epitaxial growth apparatus has a rotatable mounting plate (susceptor), and a plurality of satellites are provided on the mounting plate so as to surround the rotating shaft of the mounting plate. As the satellite is caused to be able to rotate on its axis by a rotation driving mechanism, a SiC substrate placed on the satellite revolves around the rotating shaft of the mounting plate and rotates on its axis. That is, the satellite is configured to be able to rotate on its axis and revolve.

In the epitaxial growth apparatus as described above, a raw material gas passes over the SiC substrate from the outside of the outer circumferential end portion of the SiC substrate placed on the mounting plate and is thus supplied to the SiC substrate. At this time, while maintaining the SiC substrate at a high temperature by heating means, an epitaxial material is deposited on the substrate to form an epitaxial film.

RELATED ART DOCUMENTS

Patent Documents

[Patent Document 1] Japanese Patent No. 2771585
[Patent Document 2] Japanese Patent No. 2835338

DISCLOSURE OF THE INVENTION

Problems to be Solved by the Invention

Here, when the SiC epitaxial film is grown on the SiC substrate, there is a problem that the carrier concentration decreases at the outer circumferential portion of the obtained SiC epitaxial film, that is, in the vicinity of the edge. This tendency is significant particularly when a SiC epitaxial film is grown on a large SiC substrate in order to obtain a large SiC epitaxial wafer. In recent years, there is a strong market demand for large SiC epitaxial wafers. Therefore, there is a demand for a method for controlling the carrier concentration in an in-plane direction even in a large SiC epitaxial wafer.

The present invention has been made taking the foregoing problems into consideration, and an object thereof is to provide a method for producing a SiC epitaxial wafer and an apparatus for producing a SiC epitaxial wafer in which the in-plane carrier concentration of the SiC epitaxial wafer can be controlled.

Means for Solving the Problem

As a result of investigations, the inventors found that the carrier concentration of a SiC epitaxial film can be controlled by supplying a carrier gas containing a dopant gas (referred to as a dopant carrier gas) from a predetermined position with respect to a SiC substrate. In addition, the inventors found a configuration of an apparatus for producing a SiC epitaxial wafer in which the carrier concentration of a predetermined portion of the SiC epitaxial wafer can be controlled with no significant changes in an existing apparatus and with efficiency.

That is, the present invention provides the following procedure in order to solve the above problems.

(1) According to an embodiment of the present invention, a method for producing a SiC epitaxial wafer, including a mounting plate having a recessed accommodation portion and a satellite which is disposed in the recessed accommodation portion and configured so that a SiC substrate is placed on an upper surface thereof, includes supplying a dopant carrier gas containing a dopant gas to an outer circumference of the SiC epitaxial wafer from between the recessed accommodation portion and the satellite.

(2) In the method for producing a SiC epitaxial wafer according to (1), the dopant carrier gas may be supplied from a bottom portion of the recessed accommodation portion, and the satellite may be rotated in the recessed accommodation portion by the dopant carrier gas.

(3) In the method for producing a SiC epitaxial wafer according to (1) or (2), a position of an upper surface of the SiC substrate may be flush with or lower than an upper surface of the mounting plate.

(4) In the method for producing a SiC epitaxial wafer according to any one of (1) to (3), the dopant gas may be a nitrogen gas.

(5) According to another embodiment of the present invention, an apparatus for producing a SiC epitaxial wafer by growing a SiC epitaxial film on a principal surface of a SiC substrate using a chemical vapor deposition method, includes: a mounting plate having a recessed accommodation portion; a satellite disposed in the recessed accommodation portion and configured so that a SiC substrate is placed on an upper surface thereof; a first gas supply pipe configured to supply a raw material gas of the SiC epitaxial film onto the principal surface of the SiC substrate placed on the satellite; a second gas supply pipe having a supply port in the recessed accommodation portion; and a gas supply portion connected to the second gas supply pipe and configured to supply a gas containing a dopant carrier gas to the second gas supply pipe.

Effects of the Invention

In the method and the apparatus for producing a SiC epitaxial wafer according to the embodiments of the present invention, the carrier concentration in the in-plane direction of SiC substrate can be controlled.

EMBODIMENT OF THE INVENTION

Figure 1:
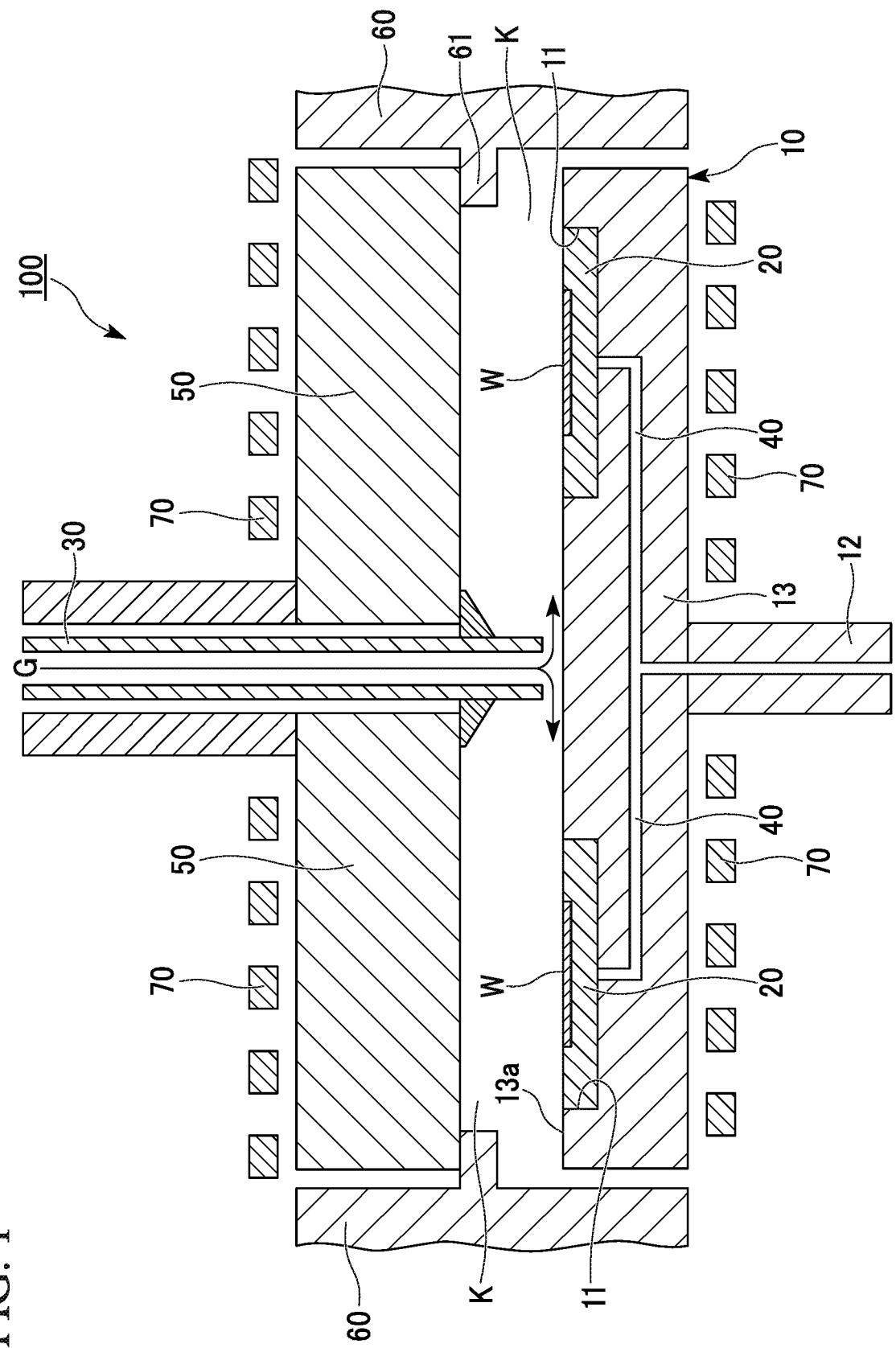
FIG. 1 is a schematic sectional view of an apparatus for producing a SiC epitaxial wafer according to an embodiment of the present invention.

A method and an apparatus for producing a SiC epitaxial wafer to which the present invention is applied will be described in detail with reference to the drawings as appropriate.

In the drawings used in the following description, in order to facilitate understanding of the features of the present invention, there are cases where characteristic portions are enlarged for convenience, and the dimensional ratio and the like of each constituent element may be different from reality. The materials, dimensions, and the like shown in the following description are merely examples, and the present invention is not limited thereto and can be embodied in appropriately modified manners in a range that does not change the gist thereof.

First, the definition of the name of gas in this specification will be described. A gas for supplying elements constituting SiC is referred to as a "raw material gas". The raw material gas includes a silane-based gas and a hydrocarbon-based gas. As the silane-based gas, silane ($SiH_4$), dichlorosilane ($SiCl_2H_2$), trichlorosilane ($SiCl_3$), silicon tetrachloride ($SiCl_4$), and the like can be used. As the hydrocarbon-based gas, propane ($C_3H_8$), ethane ($C_2H_6$), and the like can be used. There may be case where a gas containing a carrier gas and the like, which will be described later, simultaneously with the raw material gas is described as a "raw material gas" in a broad sense.

Other than the gas of the main raw materials as the constituent elements of silicon carbide, a gas for doping is referred to as "dopant gas". A material in a SiC substrate doped with the dopant gas functions as carriers in the SiC substrate. As the dopant gas for silicon carbide, nitrogen for N-type doping, ammonia, trimethylaluminum for P-type doping, and the like can be employed.

A gas that flows in a larger amount than the raw material gas during CVD crystal growth and has a function of carrying the raw material gas and the doping gas is referred to as a "carrier gas". As the carrier gas, argon (Ar), hydrogen ($H_2$), and the like can be employed. That is, the "carrier" of the "carrier gas" does not have the same meaning as the "carrier" of the "carrier density (concentration)" in the SiC substrate.

In addition, a "dopant carrier gas" means a gas containing the dopant gas, and also includes a gas in which the dopant gas and the carrier gas are mixed. For example, the dopant carrier gas may be composed only of a nitrogen gas, or a mixture of nitrogen gas and a gas such as a rare gas.

Apparatus for Producing SiC Epitaxial Wafer

For ease of understanding of the configuration, the apparatus for producing a SiC epitaxial wafer will be described first. FIG. 1 is a view schematically showing a section of the apparatus for producing a SiC epitaxial wafer according to an embodiment of the present invention.

An apparatus 100 for producing a SiC epitaxial wafer according to the embodiment of the present invention includes a mounting plate 10, satellites 20, a first gas supply pipe 30, a second gas supply pipe 40, and a gas supply portion (not shown). Furthermore, the apparatus 100 for producing a SiC epitaxial wafer includes a ceiling 50 and a side wall 60 for forming a reaction space K, and a heater 70 for heating the reaction space K. In the apparatus 100 for producing a SiC epitaxial wafer, a raw material gas G is supplied into a chamber (deposition chamber) capable of being depressurized and evacuated, and a SiC epitaxial film is grown on the surface of a SiC substrate W which is heated. The raw material gas G supplied into the chamber (deposition chamber) may be a raw material gas in a broad sense.

Figure 2:
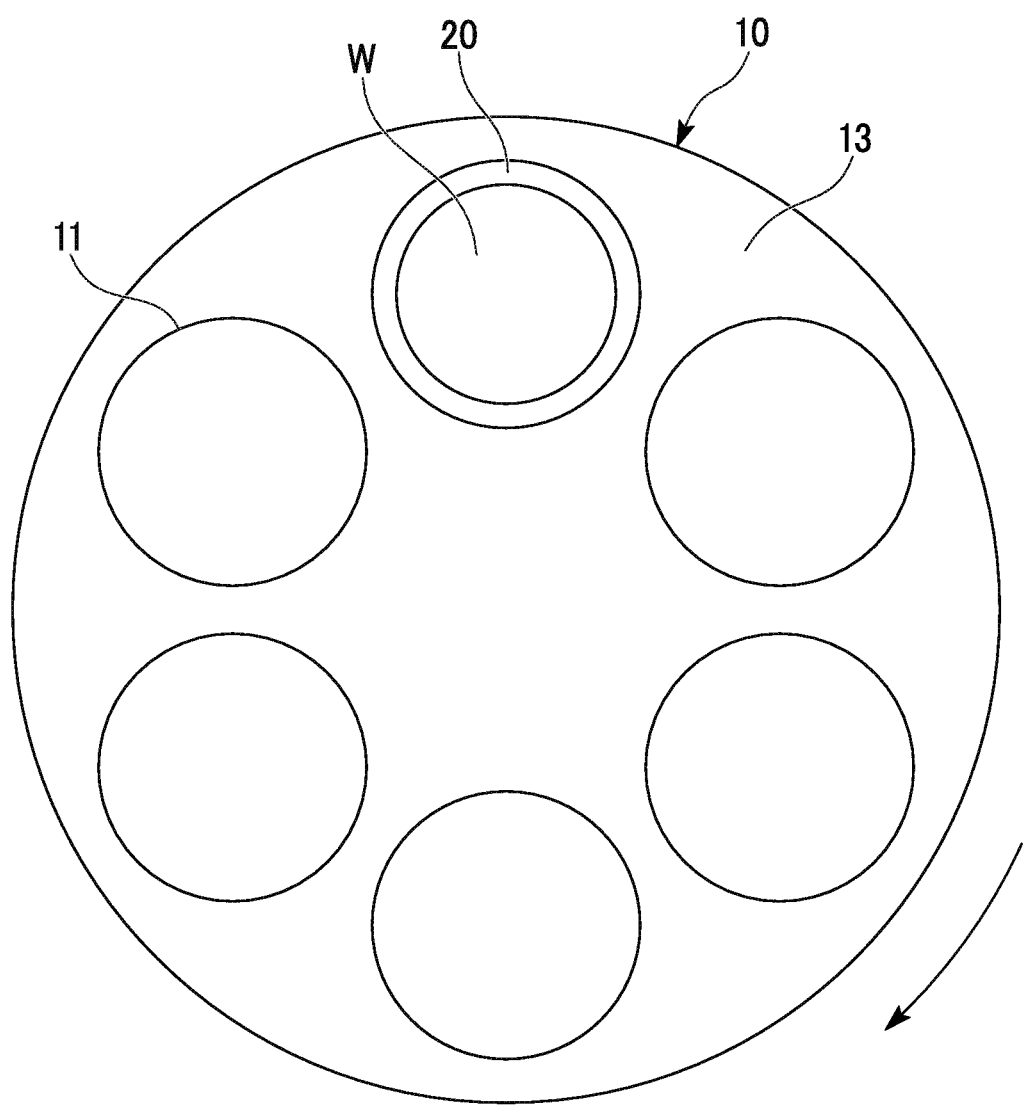
FIG. 2 is a plan view of a mounting plate in the apparatus for producing a SiC epitaxial wafer according to the embodiment of the present invention.

FIG. 2 is a plan view of the mounting plate in the apparatus for producing a SiC epitaxial wafer according to the embodiment of the present invention.

The mounting plate 10 includes a rotating table 13 having a circular shape in a plan view and a rotating shaft 12 connected to the center of the rotating table 13. On the rotating table 13, a plurality of recessed accommodation portions 11 are arranged at equal intervals in the circumferential direction (rotational direction) of the rotating table 13. FIG. 2 shows a case where six recessed accommodation portions 11 are arranged at equal intervals. For simplicity, the satellite 20 is accommodated only in one recessed accommodation portion 11 of the mounting plate 10, but the apparatus is not limited to this configuration.

The rotating shaft 12 is attached to the lower center portion of the mounting plate 10. As the rotating shaft 12 is rotated by a driving motor (not shown), the rotating table 13 can be driven to rotate about its center axis. Hereinafter, the rotation around the rotating shaft 12 as the center axis may be referred to as "revolution".

The mounting plate 10 may have heat resistance, and a known material can be used. For example, graphite, graphite coated with TaC, graphite coated with SiC, and the like can be used.

Figure 3:
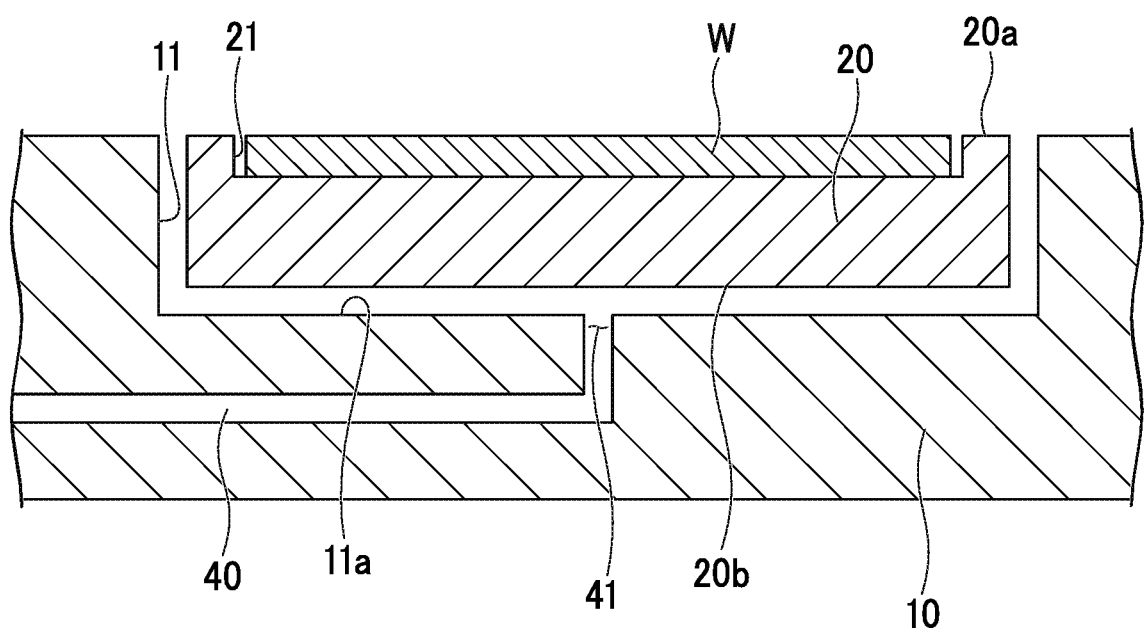
FIG. 3 is a schematic enlarged sectional view showing the vicinity of one satellite in the apparatus for producing a SiC epitaxial wafer according to the embodiment of the present invention.

FIG. 3 is a schematic enlarged sectional view showing the vicinity of one satellite in the apparatus for producing a SiC epitaxial wafer according to the embodiment of the present invention.

The satellite 20 is accommodated in the recessed accommodation portion 11 of the mounting plate 10. The satellite 20 can be caused to rotate on its axis by rotation driving means provided inside the recessed accommodation portion 11. That is, the satellite 20 can rotate and revolve about the rotating shaft 12. A material similar to that of the mounting plate 10 can be used for the satellite 20.

It is preferable that the outer diameter of the satellite 20 and the inner diameter of the recessed accommodation portion 11 have substantially the same size and the recessed accommodation portion 11 is slightly large. When the size of the recessed accommodation portion 11 is significantly larger than that of the satellite 20, when the satellite 20 rotates on its axis, the satellite 20 easily slips sideways in the recessed accommodation portion 11, and it becomes difficult to obtain a uniform SiC epitaxial film. On the other hand, when the satellite 20 and the recessed accommodation portion 11 are the same in size, a flow path for a gas supplied from the second gas supply pipe 40, which will be described later, cannot be sufficiently secured.

The SiC substrate W is placed on the satellite 20. As shown in FIG. 3, the SiC substrate W is preferably placed in a recessed portion 21 formed on an upper surface 20a of the satellite 20. As the SiC substrate W is placed in the recessed portion 21, the SiC substrate W can be prevented from slipping sideways due to rotation or the like.

The placement surface of the satellite 20 for the SiC substrate is desirably circular. In a case where the SiC substrate W is provided with an orientation flat (OF), the placement surface may have a linear portion with a similar shape to the SiC substrate W to correspond to the OF. When there is a portion that is not covered by the SiC substrate W on the placement surface of the satellite 20, crystals are also deposited on the portion. There may be cases where the SiC substrate W floats on the deposit with respect to the placement surface. Therefore, by providing the linear portion in the placement surface, deposition of unnecessary crystals on the placement surface outside of the OF can be prevented.

It is preferable that the upper surface of the SiC substrate W on which the SiC substrate W is placed is flush with or lower than a rotating table upper surface 13a. In a case where the SiC substrate W is higher than the rotating table upper surface 13a, the raw material gas hits the end portion of the SiC substrate W such that turbulent flow (turbulence of laminar flow) of the raw material gas easily occurs. When turbulent flow of the raw material gas occurs, there may be cases where the film formed at the end portion of the SiC substrate W is different in characteristics from the inside.

A first end portion of the first gas supply pipe 30 is connected to a gas supply pipe (not shown), and a second end portion thereof is connected to the reaction space K surrounded by the ceiling 50, the side wall 60, and the mounting plate 10. The raw material gas G can be supplied to the reaction space K through the first gas supply pipe 30. As the raw material gas G, a gas containing a hydrocarbon-based gas and a silane-based gas, which are generally used as the raw materials for the SiC epitaxial film, can be used. As the hydrocarbon-based gas and the silane-based gas, those described above can be used. From the first gas supply pipe 30, the carrier gas and the dopant gas may be supplied simultaneously with the raw material gas.

As shown in FIG. 1, the second end portion (supply port on the reaction space side) of the first gas supply pipe 30 is preferably provided to face the center of the mounting plate 10. Since the supply port of the first gas supply pipe 30 is provided to face the center of the mounting plate 10, the flow of the raw material gas supplied from the first gas supply pipe 30 can be controlled to be in a direction from the center to the outer circumference of the mounting plate 10. That is, the raw material gas can be uniformly supplied to the satellite 20 placed on the mounting plate 10.

A first end portion of the second gas supply pipe 40 is connected to an external tank (not shown) or the like, and a second end portion thereof is connected to the recessed accommodation portion 11. Here, the external tank or the like corresponds to the "gas supply portion" in the claims. As the gas supply portion, a tank storing the dopant carrier gas may be used. Furthermore, as the gas supply portion, a gas mixing apparatus which mixes a carrier gas such as hydrogen and a doping gas at controlled flow rates can be used. The gas mixing apparatus mixes the carrier gas and the dopant gas in a constant ratio to supply a portion or the entirety of the mixed gas to the second gas supply pipe at a predetermined flow rate and a pressure and can be configured with a mass flow controller, a pressure controller, or the like. In FIG. 1, the second gas supply pipe 40 is formed so as to penetrate through the inside of the rotating shaft 12 and the rotating table 13 of the mounting plate 10 and has a supply port 41 in the upper surface 11a of the recessed accommodation portion 11.

The second gas supply pipe 40 has the supply port 41 in the upper surface 11a of the recessed accommodation portion 11. Therefore, in a case where the satellite 20 is accommodated in the recessed accommodation portion 11, the gas is supplied between a lower surface 20b of the satellite 20 and the recessed accommodation portion 11. The satellite 20 floats slightly from the upper surface of the recessed accommodation portion 11 by the gas supplied from the supply port 41. Therefore, the frictional force applied between the recessed accommodation portion 11 and the satellite 20 decreases, and the satellite 20 becomes rotatable about its center. As the satellite 20 is driven to rotate around its center axis, it is possible to uniformly deposit a film on the SiC substrate W placed on the satellite 20.

The satellite 20 may be configured such that the rotation thereof is controlled by the gas discharged from the supply port 41. The gas discharged from the supply port 41 can have a function of floating the satellite 20 and a function of rotating the satellite 20. In order to rotate the satellite 20, for example, there is a method of forming a spiral groove in the bottom surface of the recessed accommodation portion 11 and causing the gas to flow along the groove to apply a torque to the satellite 20 with the viscosity and rotate the satellite 20. Alternatively, a spiral groove may be formed in the rear surface side of the satellite 20 and the gas flow may be caused to flow along the groove so as to be provided with the same function. That is, there is no need to separately prepare driving means having an external power source or the like to rotate the satellite 20, and the configuration of the apparatus for producing a SiC epitaxial can be simplified.

As described above, the gas supplied from the supply port 41 has the function of floating the satellite and the function of rotating the satellite. These functions may be provided by gas from one kind of supply port, or the floating function and the rotating function of may be provided by gas from different supply ports. In a case of using the different supply ports, the dopant carrier gas may be caused to flow from one supply port having any of the function of rotating the satellite, and the function of floating the satellite, and the dopant carrier gas may be supplied to the outer circumference of the SiC epitaxial wafer from between the recessed portion accommodation portion and the satellite.

The second gas supply pipe 40 supplies the dopant carrier gas containing the dopant gas to the reaction space K from the external tank (not shown). As shown in FIG. 3, the dopant carrier gas supplied from the second gas supply pipe 40 is supplied to the reaction space K via between the recessed accommodation portion 11 and the satellite 20. That is, considering the SiC substrate W placed on the satellite 20 as a reference, the dopant carrier gas is supplied toward the center from the outer circumference thereof. Therefore, the carrier concentration on the outer circumference of the SiC substrate W can be higher than the carrier concentration at the center.

If the gas supplied from the second gas supply pipe 40 does not contain the dopant gas, the carrier concentration of the outer circumference of the SiC substrate W decreases. In this case, by adding the dopant gas to the raw material gas supplied from the first gas supply pipe 30, a dopant element can be supplied to the SiC epitaxial film. That is, by causing the gas supplied from the second gas supply pipe 40 to contain the dopant gas, the carrier concentration of the outer circumference of the SiC epitaxial film can be increased. As a result, by causing the gas supplied from the second gas supply pipe 40 to contain the dopant gas, a uniform SiC epitaxial film can be grown.

The ceiling 50 is disposed to cover the mounting plate 10 and the satellite 20 from above.

Like the mounting plate 10 and the satellite 20, the ceiling 50 is a disk-shaped member in which the surface of a base material made of graphite is coated. A coating film for coating the surface of the ceiling 50 can also be formed using hitherto known TaC, SiC, or the like.

As the side wall 60, a known one can be used. For example, one having a support portion 61 as shown in FIG. 1 can be used. The support portion 61 is a ceiling support portion provided over the entire circumference of the inner circumferential surface of the circumferential wall 60, and the outer circumferential portion of the ceiling 50 is placed on the ceiling support portion. Gas, which becomes unnecessary in the chamber, can be discharged to the outside of the chamber from an exhaust port provided between the side wall 60 and the mounting plate 10.

The heater 70 heats the reaction space K. For example, an induction coil or the like can be used. When high-frequency current is supplied from a high-frequency power source (not shown) to the induction coil, the mounting plate 10 and the ceiling 50 are heated by high-frequency induction heating. The SiC substrate W placed on the satellite 20 can be heated by radiation from the mounting plate 10 and the ceiling 50, heat conduction from the satellite 20, and the like. The heating means is not limited to the configuration disposed on the lower surface side of the mounting plate 10 (the rotating table 13) and the upper surface side of the ceiling 50, and may also adopt a configuration disposed on only one side thereof. Furthermore, the heating means is not limited to the high-frequency induction heating, and resistive heating or the like may also be used.

When the apparatus 100 for producing a SiC epitaxial wafer according to the embodiment of the present invention is used, a SiC epitaxial wafer in which the in-plane uniformity of the carrier concentration is high can be produced. In addition, the carrier density of a predetermined portion of the SiC epitaxial wafer can be increased with no significant changes in an existing apparatus and with efficiency. Therefore, a SiC epitaxial wafer in which the in-plane uniformity of the carrier concentration is high can be produced easily and inexpensively.

Method for Producing SiC Epitaxial Wafer

The method for producing a SiC epitaxial wafer according to the embodiment of the present invention is a method for producing a SiC epitaxial wafer, including a mounting plate having a recessed accommodation portion and a satellite which is disposed in the recessed accommodation portion and configured so that a SiC substrate is placed on an upper surface thereof, includes supplying a dopant carrier gas containing a dopant gas to the outer circumference of the SiC epitaxial wafer from between the recessed accommodation portion and the satellite.

The method for producing a SiC epitaxial wafer will be described based on the example using the apparatus 100 for producing a SiC epitaxial wafer in FIG. 1.

First, a SiC substrate W placed on the satellite 20 is prepared. The SiC substrate W can be obtained by slicing an ingot of SiC single crystal into a disk shape with a wire saw or the like. Furthermore, the outer circumferential portion may be chamfered. In this case, a growth method of SiC bulk single crystal, an ingot grinding method, a slicing method, and the like are not particularly limited, and hitherto known methods can be adopted.

Next, the obtained SiC substrate W is polished. As a polishing method, a hitherto known method can be adopted. For the polishing, it is preferable to perform each of rough polishing and mirror polishing. The rough polishing can be performed using a mechanical polishing method such as lap polishing. Unevenness such as large undulation and processing strain in the SiC substrate W can be removed by the rough polishing. The mirror polishing can be performed by, for example, a CMP method. By the mirror polishing, it is possible to further enhance the flatness of the SiC substrate of which the unevenness and the degree of parallelism are adjusted by the rough polishing.

Next, a SiC epitaxial film is grown on the obtained SiC substrate W.

First, the SiC substrate W is placed on the satellite 20 of the apparatus 100 for producing a SiC epitaxial wafer described above.

After the SiC substrate W is placed, the reaction space K is evacuated by a vacuum pump (not shown), and then gas such as hydrogen or argon is caused to flow from the first gas supply pipe 30 to achieve a constant depressurized state. In addition, the reaction space K is heated by the heater 70. Furthermore, the rotating shaft 12 is driven to rotate by the driving motor (not shown) and the satellite 20 is rotated. The rotation of the satellite 20 is preferably achieved by the gas supplied from the second gas supply pipe 40. By using the gas supplied from the second gas supply pipe 40, the apparatus can be prevented from being complicated. The satellite 20 rotates and revolves about the rotating shaft 12.

In this state, the raw material gas G is further supplied from the first gas supply pipe 30. The raw material gas G supplied to the reaction space K spreads from the center toward the outer circumference of the mounting plate 10, passes between the mounting plate 10 and the side wall 60, and is discharged to the outside. At this time, in the SiC substrate W placed on the satellite 20, the silane-based gas and the hydrocarbon-based gas in the raw material gas react with each other such that the SiC epitaxial film grows. Furthermore, by mixing the dopant gas in the raw material gas, the SiC epitaxial film containing a dopant element functioning as a dopant in a semiconductor can be grown.

The gas supplied from the second gas supply pipe 40 is supplied to the reaction space K via between the recessed accommodation portion 11 and the satellite 20. Therefore, considering the SiC substrate W as a reference, the gas supplied from the second gas supply pipe 40 is supplied toward the center from the outer circumference thereof. Therefore, by causing the dopant gas to be contained in the gas supplied from the second gas supply pipe 40, the carrier concentration of the outer circumferential portion with respect to the center portion of the SiC epitaxial film that epitaxially grows can be increased.

There may be cases where the carrier concentration of the outer circumference of the SiC substrate W is decreased only by adding a dopant element functioning as a dopant of SiC to the raw material gas G supplied from the first gas supply pipe 30. In such cases, the carrier concentration distribution in the SiC epitaxial surface is adjusted by adjusting the flow rate, pressure, and the like of the carrier gas. However, there is a limit as the SiC substrate has a larger diameter. Furthermore, the basic conditions such as the flow rate and pressure of the carrier gas affect the characteristics other than the carrier concentration distribution, such as the growth film thickness distribution, and thus cannot be arbitrarily changed. On the other hand, in the method of supplying the dopant element from the second gas supply pipe 40 as the dopant gas, the carrier concentration of the outer circumference of the SiC substrate W can be increased without affecting the basic conditions such as the flow rate and pressure of the carrier gas of the raw material gas. Therefore, it is possible to obtain a SiC epitaxial wafer having both the other characteristics and a uniform carrier concentration. The dopant element supplied from the second gas supply pipe 40 relatively increases only the carrier concentration of the outer circumference of the SiC epitaxial wafer in the in-plane distribution of the carrier concentration while being uniformly doped in the vicinity of the center and thus hardly effects the form of the carrier concentration distribution in the vicinity of the center.

The total amount of the gas supplied from the second gas supply pipe 40 with respect to the total amount of the gas supplied from the first gas supply pipe 30 is preferably $\frac{1}{300}$ to $\frac{1}{50}$. By causing the total amount of the gas supplied from the second gas supply pipe 40 to be smaller than the total amount of the gas supplied from the first gas supply pipe, the flow of the gas in the chamber can be controlled to primarily in a direction from the center to the outer circumference of the mounting plate 10, thereby suppressing the occurrence of turbulence and the like.

The ratio of the flow rate of the dopant gas contained in the dopant carrier gas supplied from the second gas supply pipe 40 to the flow rate of the dopant gas contained in the gas supplied from the first gas supply pipe 30 is preferably 100:1 to 0:1, more preferably 50:1 to 10:1, and even more preferably 40:1 to 30:1. That is, all of the dopant gas can also be supplied from the second gas supply pipe. Within this range, the carrier concentration of the outer circumference of the SiC substrate W decreased by the dopant carrier gas supplied from the first gas supply pipe 30 can be suitably compensated for by the dopant carrier gas supplied from the second gas supply pipe 40. That is, the uniformity of the carrier concentration of the SiC epitaxial wafer can be further enhanced.

In addition, the dopant gas contained in the dopant carrier gas supplied from the second gas supply pipe 40 is incorporated into the epitaxial wafer more efficiently than the dopant gas supplied from the first gas supply pipe 30. Therefore, the absolute amount of the dopant introduced into the reaction space to obtain the same carrier concentration can be reduced. This feature can reduce the memory effect due to the dopant gas. Therefore, for example, in a case where an epitaxial layer with a high carrier concentration and a low carrier concentration are continuously laminated, this feature is more effective than a method in a related.

In addition, the dopant carrier gas supplied from the second gas supply pipe is uniformly supplied to the wafer in all directions from the vicinity of the circumferential portion of the wafer. Accordingly, it is possible to uniformly and reliably supply the dopant gas to the outer circumferential portion of the wafer in the circumferential direction.

It is preferable that mixing of the dopant gas in the gas supplied from the second gas supply pipe 40 is performed simultaneously with or after supplying the raw material gas G from the first gas supply pipe 30. It is preferable that in the stage of supplying the raw material gas G from the first gas supply pipe 30, the satellite 20 rotates on its axis. On the other hand, it is preferable that before the raw material gas G is supplied onto the SiC substrate W, the dopant gas is not supplied onto the SiC substrate W. This is because the SiC substrate W itself is also made of SiC single crystal and reacts with the dopant gas.

Therefore, it is preferable that the gas supplied from the second gas supply pipe 40 supplies the carrier gas (for example, a rare gas) that does not contribute to the reaction until the raw material gas G is supplied onto the SiC substrate W, and simultaneously with or after the supply of the raw material gas G onto the SiC substrate W, the dopant carrier gas containing the dopant gas is used as the gas supplied from the second gas supply pipe 40. As described above, by setting the timing at which the dopant gas is mixed in the gas supplied from the second gas supply pipe 40 to the same time as or after the supply of the raw material gas G from the first gas supply pipe 30, the controllability of the carrier concentration can be further enhanced.

In a case where a plurality of epitaxial layers are stacked, for each of the epitaxial layers, epitaxial growth in which a growth step of using the carrier gas that does not contain the dopant gas as the gas supplied from the second gas supply pipe 40 and a growth step of using the dopant carrier gas containing the dopant gas are alternately present may be employed.

Although the rotation and revolution type epitaxial growth apparatus has been described, the epitaxial growth apparatus is not limited to the rotation and revolution type epitaxial growth apparatus as long as the configuration in which the dopant carrier gas containing the dopant gas is supplied to the outer circumference of the SiC epitaxial wafer from between the recessed accommodation portion and the satellite is included. For example, an apparatus in which a wafer only rotates on its axis may be employed, or an apparatus in which a wafer only revolves and a satellite only floats may also be employed.

According to the method for producing a SiC epitaxial wafer according to the embodiment of the present invention, the controllability of the carrier concentration in the in-plane direction of the SiC epitaxial film grown on the SiC substrate can be enhanced.

While the preferred embodiments of the present invention have been described above in detail, the present invention is not limited to the specific embodiments, and various changes and modifications may be made without departing from the scope of the present invention described in the claims.

EXAMPLES

Hereinafter, effects of the present invention will be concretely described with reference to examples. The present invention is not limited to these examples.

Example 1

In Example 1, first, a SiC substrate (6-inch, 4H-SiC-4° off-axis substrate) was prepared. In addition, six satellites were installed on a mounting plate having six recessed accommodation portions as an apparatus for producing a SiC epitaxial film. A SiC epitaxial film was grown to 8 μm to 10.5 μm while causing a SiC wafer placed on the satellite to rotate on its axis and revolve. From a first gas supply pipe, silane and propane as a raw material gas and hydrogen as a carrier gas were supplied. Furthermore, from a second gas supply pipe, a dopant carrier gas containing nitrogen as a dopant gas and primarily containing hydrogen was supplied. The ratio (B/A) of the total flow rate B of the gas supplied from the second gas supply pipe to the total flow rate A of the gas supplied from the first gas supply pipe was 0.0076 times.

Furthermore, regarding the dopant gas, the ratio (D/C) of the amount D of the nitrogen gas supplied from the second gas supply pipe to the amount C of the nitrogen gas supplied from the first gas supply pipe, that is, the ratio of the flow rate of nitrogen supplied from the second gas supply pipe to the flow rate of the dopant gas flowing from the first gas supply pipe as the gases respectively supplied from the gas supply pipes was 0.056. In addition, the deposition temperature was 1600° C.

Example 2

Example 2 is different from Example 1 only in that the total flow rate of the gas supplied from the second gas supply pipe was changed. The flow rate of nitrogen supplied from the second gas supply pipe with respect to the flow rate of the dopant gas flowing from the first gas supply pipe was 0.028 times.

Comparative Example 1

Comparative Example 1 is different from Example 1 in that the dopant gas was caused to flow only from the first gas supply pipe and the dopant gas was not contained in the second gas supply pipe. The other conditions were the same as in Example 1.

Figure 4:
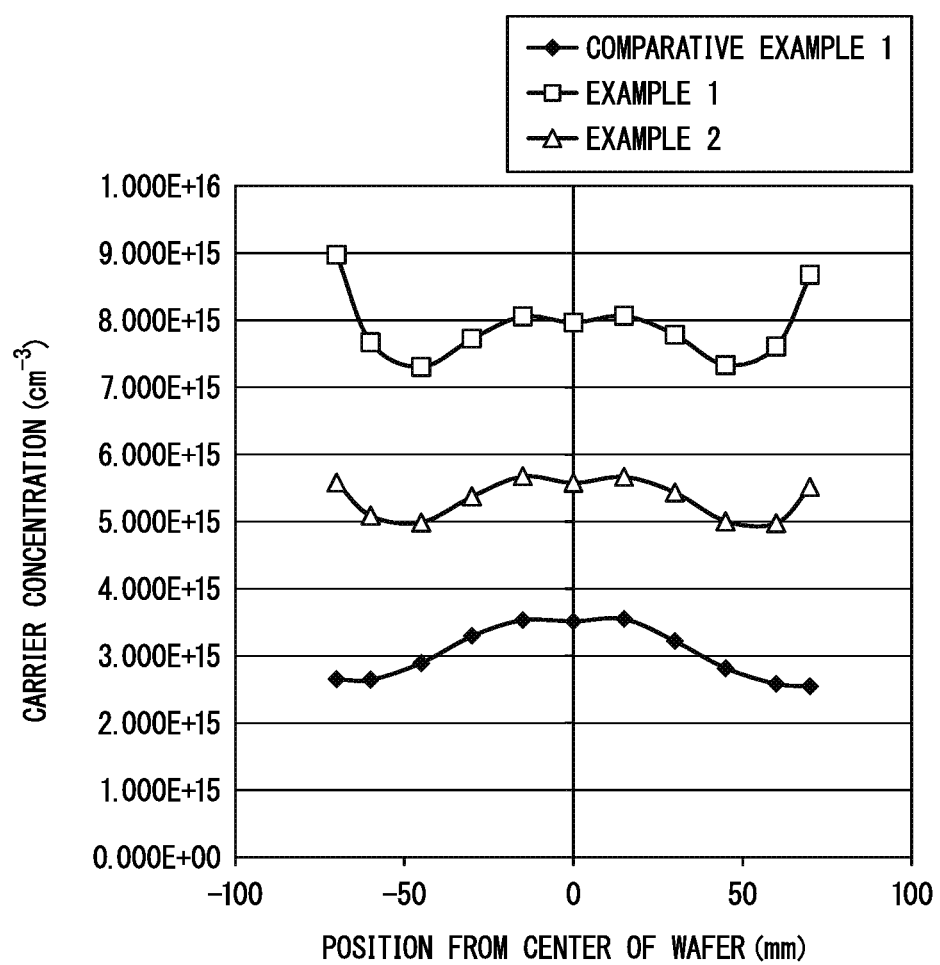
FIG. 4 is a graph showing the position dependence of a carrier concentration in an in-plane direction of SiC epitaxial films obtained in Examples 1 and 2 and Comparative Example 1.

FIG. 4 is a graph showing a change in the carrier concentration in the in-plane direction of the SiC epitaxial films obtained in Example 1 and Comparative Example 1. As the horizontal axis of the figure, the measurement value of the in-plane carrier concentration is represented in one direction of the diametrical directions as the horizontal axis. The vertical axis in the figure represents the carrier concentration, and the unit thereof is $cm^{-3}$. For the measurement of variation in the in-plane carrier concentration, a total of 21 points at the position and the same position orthogonal thereto were measured. The in-plane variation in the carrier concentration is indicated by the average value (max−min/ 21 points) of the measurement points. The in-plane variation in the carrier concentration in Example 1 was 22%. The in-plane variation in Example 2% was 13%. The in-plane variation in Comparative Example was 32%. In each of Examples 1 and 2, the in-plane variation in the carrier concentration was improved compared to Comparative Example 1.

As shown in FIG. 4, it can be seen that the carrier concentration of the outer circumferential portion of the SiC epitaxial films of Examples 1 and 2 is higher than the carrier concentration of the outer circumference of the SiC epitaxial film of Comparative Example 1. That is, it can be seen that the carrier concentration of the outer circumferential portion of the SiC wafer is increased by the dopant carrier gas supplied from the second gas supply pipe. As a result, it can be seen that the carrier concentration in the in-plane direction of the SiC wafer is homogenized.

Figure 5:
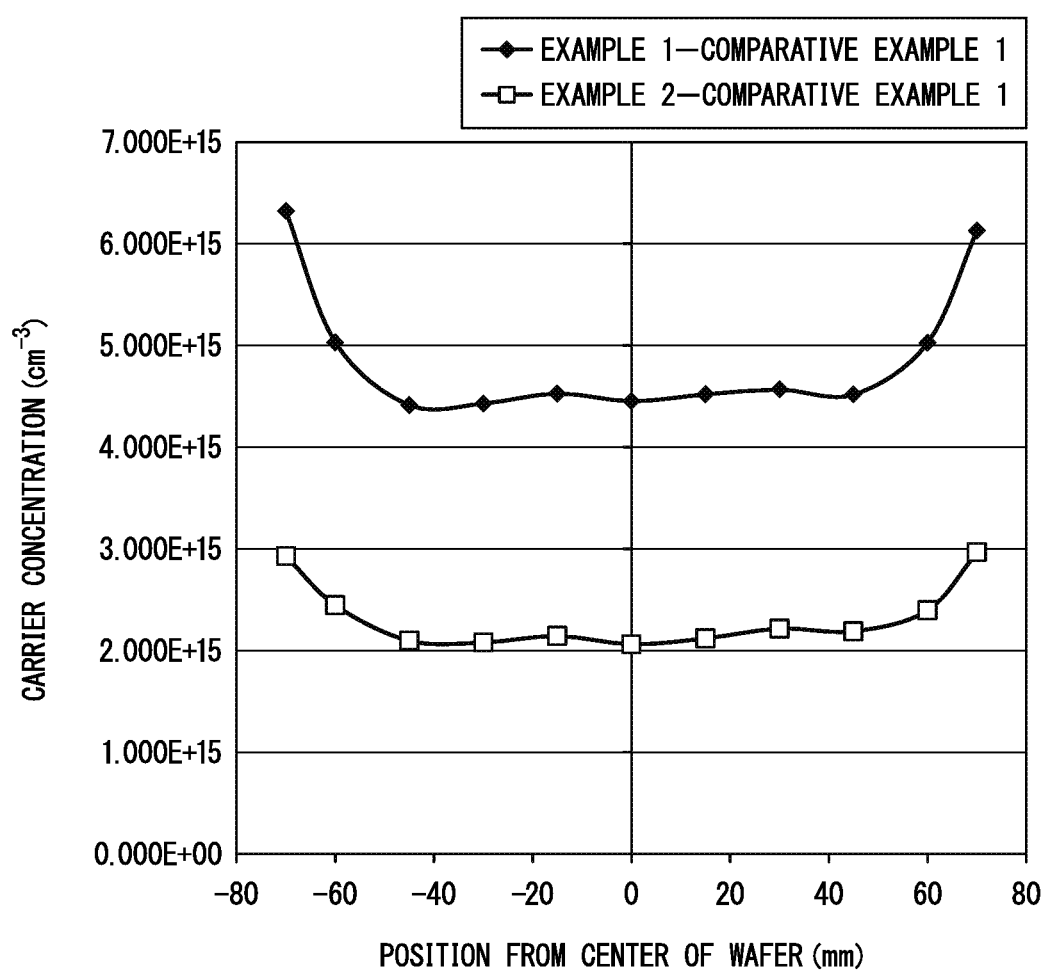
FIG. 5 is a graph showing the difference in carrier concentration between Examples 1 and 2 and Comparative Example 1.

FIG. 5 shows the difference in carrier concentration between Examples 1 and 2 and Comparative Example 1, calculated from FIG. 4. As the horizontal axis of the figure, the measurement value of the in-plane carrier concentration is represented in one direction of the diametrical directions as the horizontal axis. The vertical axis in the figure represents the carrier concentration, and the unit thereof is $cm^{-3}$. As shown in FIG. 5, in the method of performing doping by supplying the dopant carrier gas containing the dopant gas to the outer circumference of the SiC epitaxial wafer from between the recessed accommodation portion and the satellite, the carrier concentration in the peripheral portion can be intensively increased. This effectively solves the problem that the carrier concentration tends to be low at the peripheral portion of the wafer in a case where epitaxial growth on a wafer having a diameter as large as six inches or more is performed.

In addition, in FIG. 5, the carrier concentration within a radius of 50 mm is very uniform. In this case, since a wafer with a radius of 75 mm (six inches in diameter) is used, it is indicated that when this method is used, extremely uniform doping is possible at portions excluding 25 mm in the periphery. Therefore, in a case where a satellite larger than the diameter of the wafer is used for the wafer, by supplying the doping gas only from between the recessed accommodation portion and the satellite, or by supplying the doping gas to be primarily supplied from between the recessed accommodation portion and the satellite, doping with uniform in-plane distribution can be efficiently performed. At this time, the susceptor surface of the outer circumference of the wafer can achieve the same growth circumstances as those when a large wafer is placed by disposing a single crystal, polycrystal, sintered body, or the like of SiC, which is preferable.

INDUSTRIAL APPLICABILITY

The apparatus for producing a SiC epitaxial wafer according to the embodiment of the present invention can produce a SiC epitaxial wafer with excellent electrical characteristics with good productivity in the simple apparatus and thus can produce a SiC epitaxial wafer used in, for example, power devices, high-frequency devices, and high-temperature operation devices.

REFERENCE SYMBOL LIST

10: mounting plate
11: recessed accommodation portion
11a: upper surface
12: rotating shaft
13: rotating table 13a: rotating table upper surface
20: satellite
20a: upper surface
20b: lower surface
21: recessed portion
30: first gas supply pipe
40: second gas supply pipe
41: supply port
50: ceiling
60: side wall
61: support portion
70: heater
100: apparatus for producing SiC epitaxial wafer
G: raw material gas
K: reaction space
W: SiC wafer

What is claimed is:

1. A method for producing a SiC epitaxial wafer, using an apparatus including a reaction space, a mounting plate having a recessed accommodation portion and a satellite which is disposed in the recessed accommodation portion and configured so that a SiC substrate is placed on an upper surface thereof, the method comprising:
providing the SiC substrate on the upper surface of the satellite;
evacuating the reaction space;
supplying a carrier gas, a dopant gas, and a first raw material gas into the reaction space from a first gas supply pipe to cause a SiC epitaxial film to grow on the SiC substrate, the first raw material gas comprising a silane gas and a hydrocarbon gas; and
supplying a dopant carrier gas to an outer circumference of the SiC epitaxial wafer from a space between the recessed accommodation portion and the satellite,
the dopant carrier gas consists of the dopant gas or a mixture of the dopant gas and the carrier gas, and
a ratio of a total amount of gas introduced from the space between the recessed accommodation portion and the satellite to the total gas introduced from the first gas supply pipe is 1/300 to 1/50.

2. The method for producing a SiC epitaxial wafer according to claim 1,
wherein the dopant carrier gas is supplied from a bottom portion of the recessed accommodation portion, and
the satellite is rotated in the recessed accommodation portion by the dopant carrier gas.

3. The method for producing a SiC epitaxial wafer according to claim 2,
wherein a position of an upper surface of the SiC substrate is flush with or lower than an upper surface of the mounting plate.

4. The method for producing a SiC epitaxial wafer according to claim 3,
wherein the dopant gas is a nitrogen gas.

5. The method for producing a SiC epitaxial wafer according to claim 2,
wherein the dopant gas is a nitrogen gas.

6. The method for producing a SiC epitaxial wafer according to claim 1,
wherein a position of an upper surface of the SiC substrate is flush with or lower than an upper surface of the mounting plate.

7. The method for producing a SiC epitaxial wafer according to claim 6,
wherein the dopant gas is a nitrogen gas.

8. The method for producing a SiC epitaxial wafer according to claim 1,
wherein the dopant gas is a nitrogen gas.

9. The method for producing a SiC epitaxial wafer according to claim 1,
wherein the dopant gas is a nitrogen gas, and
the carrier gas is one selected from the group consisting of argon (Ar) and hydrogen ($H_2$).

10. The method for producing a SiC epitaxial wafer according to claim 9,
wherein the dopant carrier gas is the mixture.

11. The method for producing a SiC epitaxial wafer according to claim 1,
wherein the dopant gas is a nitrogen gas,
the silane gas comprises one selected from the group consisting of silane ($SiH_4$), dichlorosilane ($SiCl_2H_2$), trichlorosilane ($SiCl_3$) and silicon tetrachloride ($SiCl_4$),
the hydrocarbon gas comprises one selected from the group consisting of propane ($C_3H_8$), ethane ($C_2H_6$), and
the carrier gas is one selected from the group consisting of argon (Ar) and hydrogen ($H_2$).

12. The method for producing a SiC epitaxial wafer according to claim 1, wherein a ratio of a flow rate of the dopant gas contained in the dopant carrier gas supplied from the second gas supply pipe to the flow rate of the dopant gas contained in the gas supplied from the first gas supply pipe is 100:1 to 10:1.

13. The method for producing a SiC epitaxial wafer according to claim 1, wherein a ratio of a flow rate of the dopant gas contained in the dopant carrier gas supplied from the second gas supply pipe to the flow rate of the dopant gas contained in the gas supplied from the first gas supply pipe is 50:1 to 10:1.

14. The method for producing a SiC epitaxial wafer according to claim 1, wherein a ratio of a flow rate of the dopant gas contained in the dopant carrier gas supplied from the second gas supply pipe to the flow rate of the dopant gas contained in the gas supplied from the first gas supply pipe is 40:1 to 30:1.

15. The method for producing a SiC epitaxial wafer according to claim 1, wherein the gas supplied from the second gas supply pipe supplies the carrier gas until the raw material gas is supplied from the first gas supply pipe, and simultaneously with or after the supply of the raw material gas from the first gas supply pipe, the dopant carrier gas containing the dopant gas is supplied from the second gas supply pipe.

16. An apparatus for producing a SiC epitaxial wafer by growing a SiC epitaxial film on a principal surface of a SiC substrate using a chemical vapor deposition method, the apparatus comprising:
a mounting plate having a recessed accommodation portion;
a satellite disposed in the recessed accommodation portion and configured so that a SiC substrate is placed on an upper surface thereof;
a first gas supply pipe configured to supply a raw material gas of the SiC epitaxial film onto the principal surface of the SiC substrate placed on the satellite;
a second gas supply pipe having a supply port in the recessed accommodation portion which is configured to supply dopant carrier gas to an outer circumference of the SiC substrate to be placed on the satellite from a space between the recessed accommodation portion and the satellite; and
a gas supply portion connected to the second gas supply pipe and configured to supply the dopant carrier gas to the second gas supply pipe, wherein the mounting plate comprises a rotating table having the recessed accommodation portion and a rotating shaft connected to a center of the rotating table, wherein the second gas supply pipe is configured to penetrate through an inside of the rotating shaft and the rotating table, wherein all terminal ends of the second gas supply pipe from which the gas containing the dopant carrier gas is flowed out are structured as the supply port in the recessed accommodation portion to supply the dopant carrier gas to the outer circumference of the SiC epitaxial wager from the space between the recessed accommodation portion and the satellite, and all source ends of the second gas supply pipe originate in the rotating shaft.

17. The apparatus for producing a SiC epitaxial wafer according to claim 16, wherein the second gas supply pipe extends through a center of the rotating shaft, and a center of an axis of the first gas supply pipe and a center axis of the rotating shaft are coaxially arranged.

18. The apparatus for producing a SiC epitaxial wafer according to claim 16, wherein the first gas supply pipe is configured to supply any one of (i) the raw material gas, (ii) a combination of the raw material gas and a carrier gas, (iii) a combination of the raw material gas and a dopant gas, and (iv) a combination of the raw material gas, a carrier gas and a dopant gas.

* * * * *